United States Patent
Gardner et al.

[11] Patent Number: 5,937,303
[45] Date of Patent: Aug. 10, 1999

[54] HIGH DIELECTRIC CONSTANT GATE DIELECTRIC INTEGRATED WITH NITROGENATED GATE ELECTRODE

[75] Inventors: Mark I. Gardner, Cedar Creek; H. Jim Fulford, Austin, both of Tex.

[73] Assignee: Advanced Micro Devices, Sunnyvale, Calif.

[21] Appl. No.: 08/960,469

[22] Filed: Oct. 29, 1997

[51] Int. Cl.⁶ ................................................. H01L 21/336
[52] U.S. Cl. ........................... 438/305; 438/308; 438/910
[58] Field of Search ..................................... 438/305, 306, 438/227, 308, 910

[56] References Cited

U.S. PATENT DOCUMENTS

| | | | |
|---|---|---|---|
| 4,897,368 | 1/1990 | Kobushi et al. | 437/200 |
| 5,250,456 | 10/1993 | Bryant | 437/47 |
| 5,470,764 | 11/1995 | Ikegami et al. | 437/24 |
| 5,516,707 | 5/1996 | Loh et al. | 437/24 |
| 5,567,638 | 10/1996 | Lin et al. | 437/46 |
| 5,605,848 | 2/1997 | Ngaoaram | 437/24 |
| 5,610,084 | 3/1997 | Solo De Zaldivar | 437/24 |
| 5,851,893 | 12/1998 | Gardner et al. | 438/305 |
| 5,861,335 | 1/1999 | Huase et al. | 438/308 |

*Primary Examiner*—John F. Niebling
*Assistant Examiner*—Michael S. Lebentritt
*Attorney, Agent, or Firm*—Joseph Lally; Dewan & Lally, L.L.P.

[57] ABSTRACT

A semiconductor process for forming a gate electrode of an MOS transistor. A gate dielectric is deposited on an upper surface of a semiconductor substrate. A dielectric constant of the gate dielectric layer is in the range of approximately 25 to 300. A thickness of the gate dielectric is in the range of approximately 50 to 1,000 angstroms. A conductive gate layer is then formed on the gate dielectric layer. A first nitrogen distribution is then introduced into the gate dielectric layer. The introduction of the first nitrogen distribution is typically accomplished by implanting a first nitrogen bearing species into the gate dielectric layer. Ideally, a peak impurity concentration of the first nitrogen distribution is located at an interface between the semiconductor substrate and the gate dielectric layer. Thereafter, a second nitrogen distribution is introduced into the gate dielectric layer. The peak impurity concentration of the second nitrogen distribution is ideally located at approximately an interface between the gate dielectric layer and the conductive gate layer. In the preferred embodiment, the gate dielectric layer includes an oxide incorporation a material such as beryllium, magnesium, zirconium, calcium, titanium, or tantalum.

15 Claims, 2 Drawing Sheets

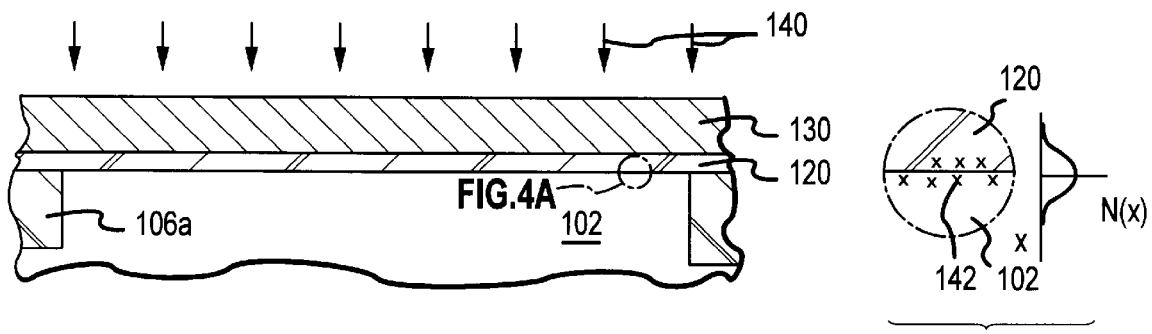
FIG.4
FIG.4A
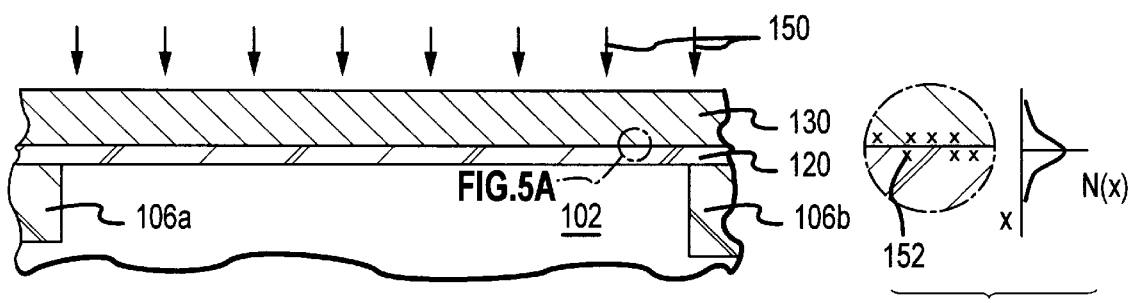
FIG.5
FIG.5A
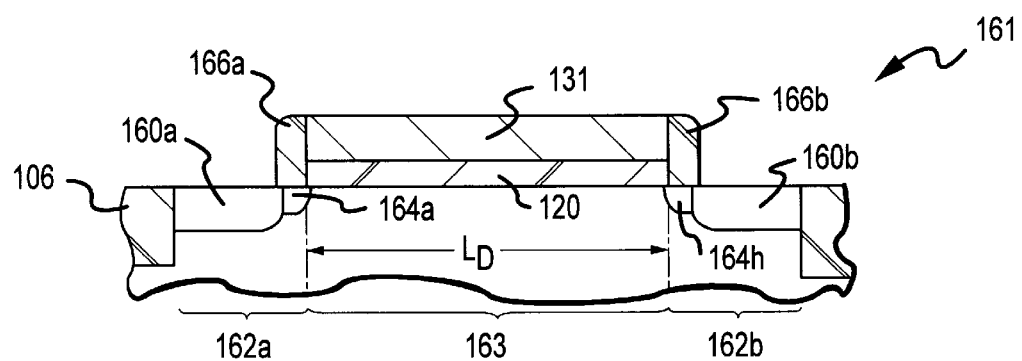
FIG.6

HIGH DIELECTRIC CONSTANT GATE DIELECTRIC INTEGRATED WITH NITROGENATED GATE ELECTRODE

BACKGROUND OF THE INVENTION

1. Field of the Invention

The present invention is related to the field of semiconductor processing and more particularly to a process for forming an MOS transistor with a high K gate dielectric.

2. Description of the Relevant Art

The fabrication of MOS (metal-oxide-semiconductor) transistors is well known. Typically, a silicon substrate is divided into a plurality of active and isolation regions through an isolation process. After appropriate cleaning of the substrate surface, a thin gate oxide is then grown on an upper surface of the substrate over the active regions. Next, a plurality of polysilicon gates are formed on the gate oxide layer. Each gate traverses an active region of the substrate thereby effectively dividing the active region into a pair of regions referred to as source/drain regions. After formation of the polysilicon gates, the source/drain regions are implanted with an impurity concentration sufficient to render the source/drain regions conductive. The implantation of the source/drain regions after the formation of the polysilicon gate insures that the gate is self aligned to the source/drain regions and, consequently, to the device channel region as well.

As transistor channel lengths fall below 0.5 microns, the limitations of conventional transistor processing become more apparent. In particular, short channel effects emerge as a problem for transistors with channel lengths of less than approximately 2 microns. For devices of this size, the depletion regions around the negatively biased drain/substrate and source/substrate junctions during normal circuit operation begin to approach a size comparable to the channel length. Under these circumstances, the transistor drain current fails to saturate (i.e., the drain current is a function of drain voltage regardless of the drain voltage value), sub-threshold leakage begins to exhibit a dependence on the drain voltage, and the threshold voltages exhibits dependence on the transistor geometries and the specific biasing conditions. From experimental data, it has been observed that the onset of short channel behavior is, to a first order approximation for a given starting material under a given set of biasing conditions, a function of the junction depth and the thickness of the gate oxide. See, e.g., Sze, *Physics of Semiconductor Devices* p. 471 (Wiley & Sons 1981). Accordingly, semiconductor manufacturers typically attempt to simply scale these other critical dimensions of the transistor to achieve smaller channel length devices without incurring significant short channel behavior.

The preceding discussion indicates that increasingly thin gate oxide films are required to maintain adequate performance in deep sub-micron transistors. Thin gate oxides, however, are difficult to consistently manufacture and are susceptible to reliability problems. Typically, the maximum electric field that may be sustained across an oxide film without resulting in oxide breakdown is in the vicinity of approximately 6 MV/cm. If a particular process is designed to operate with a 3.3 V gate voltage, oxide films of less than approximately 55 angstroms in thickness may be susceptible to reliability problems. This minimum oxide thickness imposes a significant restraint on transistor and, ultimately, device performance in the deep sub-micron region.

In addition to manufacturing and reliability concerns presented by thin oxides, the migration of mobile contaminants across the gate oxide film and into active regions of the device increases as oxide thickness decreases. This problem is especially acute for boron implanted gate structures typically associated with p-channel transistors because of the relatively high rate at which boron atoms tend to diffuse through an oxide film. Because boron atoms are p-type dopants in a silicon lattice, excessive boron migration into the channel region of the transistor can result in a measurable and undesirable shift in threshold voltage for p-channel transistors.

Therefore, it would be highly desirable to implement a process for manufacturing MOS transistors that eased the concerns associated with thin oxide films without degrading transistor performance or subthreshold leakage.

SUMMARY OF THE INVENTION

The problems identified in the above are in large part addressed by a semiconductor manufacturing process in which a gate electrode of an MOS transistor is fabricated with a material that has a high dielectric constant enabling the formation of gate dielectric layers that are thicker than the gate dielectric layers of conventional silicon dioxide MOS transistors.

Broadly speaking, the present invention contemplates a semiconductor process for the formation of a gate electrode of an MOS transistor. A gate dielectric layer is deposited on an upper surface of a semiconductor substrate. A dielectric constant of the gate dielectric layer is in the range of approximately 25 to 300. A thickness of the gate dielectric is in the range of approximately 50 to 1,000 angstroms. After the gate dielectric layer is deposited, a conductive gate layer is formed on the gate dielectric layer. A first nitrogen distribution is then introduced into the gate dielectric layer by implanting a first nitrogen bearing implant species into the gate dielectric layer using a first implant energy and a first implant dose. A peak impurity concentration of the first nitrogen distribution resides approximately at a depth of the interface between the semiconductor substrate and the gate dielectric layer. A second nitrogen distribution is then introduced into the high K dielectric layer by implanting a second nitrogen bearing impurity distribution using a second implant energy and a second implant dose. A peak concentration of the second nitrogen distribution will reside approximately at a depth of the interface between the gate dielectric layer and the conductive gate layer.

In a preferred embodiment, a suitable material for the gate dielectric layer includes $Be_xO_y$, $Mg_xO_y$, $ZrO_2$, $Ca_xO_y$, $TiO_2$, and $Ta_2O_5$. Preferably, the step of depositing the gate dielectric comprises immersing the semiconductor substrate in a CVD reactor chamber comprising an oxygen bearing ambient maintained at a temperature of approximately 200 to 900° C. and a pressure of approximately 2 torrs. In the preferred embodiment, the formation of the conductive gate layer is accomplished by a polysilicon deposition process in which silane is thermally decomposed in a CVD reactor chamber maintained at a pressure in the range of approximately 580 to 650° C. and a pressure of less than approximately 2 torrs. Preferably, the formation of the conductive gate layer further includes the introduction of a gate impurity distribution into the polysilicon layer. The concentration of the gate impurity distribution is sufficient to reduce a sheet resistivity of the polysilicon to less than approximately 50 Ω/square. In the preferred embodiment, the first implant energy is in the range of approximately 50 to 1000 keV and the first implant dose is in the range of approximately $1 \times 10^{13}$ to $5 \times 10^{15}$ atoms/cm². In the preferred embodiment, the second implant energy is in the range of approximately 50 to 1000 keV and the second implant dose is in the range of approximately $1\times10^{13}$ to $5\times10^{15}$ atoms/cm$^2$ and the second implant energy is less than the first implant energy.

The present invention still further contemplates a process for fabricating an MOS transistor. The process includes depositing a gate dielectric layer on an upper surface of a semiconductor substrate. A dielectric constant of the gate dielectric layers in the range of approximately 25 to 300. A thickness of a gate dielectric is in the range of approximately 50 to 1,000 angstroms. A conductive gate layer is then formed on the gate dielectric layer and a first nitrogen distribution is introduced into the gate dielectric layer. The introduction of the first nitrogen distribution is accomplished by implanting a first nitrogen bearing implant species into the gate dielectric layer using a first implant energy and a first implant dose. A peak impurity concentration of the first nitrogen distribution is situated at an interface between the semiconductor substrate and the gate dielectric layer. A second nitrogen distribution is then introduced into the gate dielectric layer by implanting a second nitrogen bearing impurity distribution into the gate dielectric layer using a second implant energy and a second implant dose. A peak impurity concentration of the second nitrogen distribution is located at a depth approximately coincident with the interface between the gate dielectric layer and the conductive gate layer. The gate dielectric layer is then patterned to form a gate electrode. The gate electrode is aligned over the channel region of the semiconductor substrate. A source/drain impurity distribution is then implanted into the source/drain regions within the semiconductor substrate. The source/drain regions are laterally displaced on either side of the channel region within the semiconductor substrate. The semiconductor substrate is then annealed in and inert ambient maintained at a temperature in excess of approximately 500° C. to activate the source/drain impurity distribution.

In the preferred embodiment, a lateral dimension of the channel region is in the range of approximately 0.1 to 0.5 microns. Preferably, the formation of the conductive gate layer is accomplished by depositing a polysilicon layer on the gate dielectric layer. The polysilicon deposition preferably includes decomposing silane in a CVD reactor chamber maintained at a temperature in the range of approximately 580 to 650° C. and, thereafter, introducing a gate impurity distribution into the polysilicon layer to reduce a sheet resistivity of the polysilicon to less than approximately 50 $\Omega$/square. In the preferred embodiment, the first and second implant energies are in the range of approximately 50 to 1000 keV while the first and second doses are in the range of approximately $1\times10^{13}$ to $5\times10^{15}$ atoms/cm$^2$. Suitably, the patterning of the conducting gate layer is accomplished by forming a patterned photoresist layer on the conductive gate layer and, thereafter, performing a plasma etch process to remove portions of the conductive gate layer not protected by the patterned mask. The implanting of the source/drain impurity distributions is preferably accomplished by implanting arsenic, phosphorus, or boron into the source/drain regions. A peak concentration of the source/drain impurity distribution is preferably in excess of approximately $1\times10^{19}$ atoms/cm$^3$.

The present invention still further contemplates an MOS transistor including a semiconductor substrate, a gate dielectric, and a pair of source/drain electrodes. The semiconductor substrate includes a channel region at an upper service of the semiconductor substrate and further includes a pair of source/drain regions laterally displaced on either side of the channel region. The gate dielectric is formed on and upper surface of the semiconductor substrate and has a dielectric constant in the range of approximately 25 to 300 and a thickness in the range of approximately 50 to 1,000 angstroms. The conductive gate electrode is formed on the gate dielectric and aligned over the channel region. The pair of source/drain electrodes includes at least one source/drain impurity distribution having a peak impurity concentration in excess of approximately $1\times10_{19}$ atoms/cm$^3$. The semiconductor substrate of the MOS transistor includes a first nitrogen distribution with a peak concentration located approximately at an interface between the semiconductor substrate and the gate dielectric layer. A second nitrogen distribution within the MOS transistor is located with a peak concentration located approximately between the gate dielectric layer and the conductive gate electrode. In the preferred embodiment, the semiconductor substrate includes a p-type epitaxial layer formed on a p+ silicon bulk. A resistivity of the p-type epitaxial layer is preferably in the range of approximately 10 to 15 $\Omega$-cm. Ideally, a channel length of the transistor is in the range of approximately 0.1 to 0.5 microns and the gate dielectric is comprised of an oxygen compound including beryllium, magnesium, zirconium, calcium, titanium, or tantalum.

BRIEF DESCRIPTION OF THE DRAWINGS

Other objects and advantages of the invention will become apparent upon reading the following detailed description and upon reference to the accompanying drawings in which:

FIG. 4 is a processing step subsequent to FIG. 3 in which a first impurity distribution is introduced into the gate dielectric and located at an interface between the gate dielectric and the semiconductor substrate;

FIG. 5 is a processing step subsequent to FIG. 4 in which a second impurity distribution is introduced into the gate dielectric and situated at an interface between the conductive gate layer and the gate dielectric layer; and FIG. 6 is a processing step subsequent to FIG. 5 in which the conductive gate has been patterned and source/drain impurity distributions introduced into source/drain regions of the semiconductor substrate laterally displaced on either side of the semiconductor substrate channel region.

Figure 1:
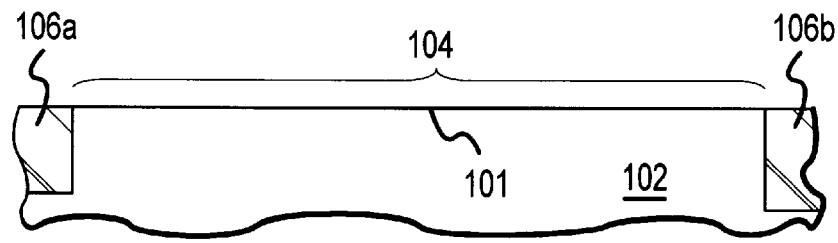
FIG. 1 is a partial cross sectional view of a semiconductor substrate including an active region laterally displaced between a pair of isolation structures.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1 shows a partial cross sectional view of a semiconductor substrate 102. Semiconductor 102 includes an active region 104 laterally displaced between a pair of isolation structures 106a and 106b (collectively referred to as isolation structures 106). Active region 104 of semiconductor substrate 102 represents the area of the substrate into which active devices such as transistors will be subsequently formed. Isolation structures 106 provide electrical and physical separation and isolation between neighboring active regions as will be appreciated to those skilled in the art of semiconductor processing. As depicted in FIG. 1, isolation structures 106 are of the shallow trench isolation variety. In a shallow trench isolation process, a trench typically of depth less than approximately one micron is etched into a semiconductor substrate and thereafter filled with a dielectric material such as a CVD silicon-oxide. Subsequent to the deposition process, the semiconductor substrate is then typically planarized to produce a substantially planar upper surface upon which subsequent processing may be more readily effected. Those skilled in semiconductor processing will appreciate that suitable alternatives embodiments of isolation structures 106 include, among others, the LOCOS type isolation structures that are well known in the industry. In the presently preferred embodiment, a starting material useful for semiconductor substrate 102 includes a single crystal silicon wafer. In an embodiment useful in the fabrication of CMOS integrated circuits, the semiconductor substrate 102 preferably includes a p-type epitaxial layer formed over a p+ silicon bulk. (For purposes of this disclosure, a p+ or n+ designation refers to a region that includes an impurity distribution in excess of approximately $10^{19}$ atoms/cm$^3$). In this embodiment, the resistivity of the p-type epitaxial layer is preferably in the range of approximately 10 to 15 Ω-cm.

Figure 2:
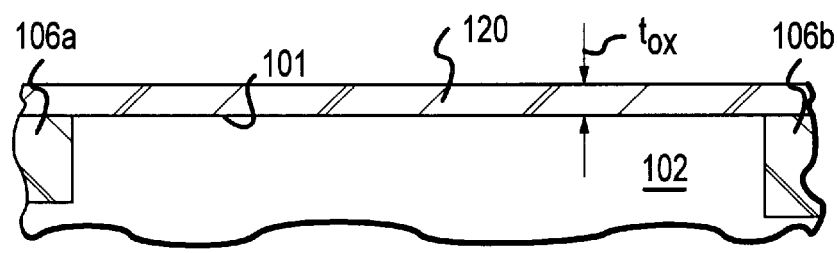
FIG. 2 is a processing step subsequent to FIG. 1 in which a gate dielectric has been formed on an upper surface of the semiconductor substrate.

Turning now to FIG. 2, a gate dielectric 120 is deposited on upper surface 101 of semiconductor substrate 102. Preferably, a thickness of gate dielectric layer 120 is in the range of approximately 50 to 1,000 angstroms and a dielectric constant of gate dielectric layer 120 is in the range of approximately 25 to 300. Those skilled in the art of semiconductor processing will appreciate that the dielectric constant associated with gate dielectric layer 120 is approximately 20 to 40 times greater than the dielectric constant of silicon-oxide typically used for gate dielectric layers. The increased dielectric constant permits the fabrication of deep sub-micron transistors without requiring ultra thin gate dielectrics associated with conventionally formed sub-micron devices. More specifically, by utilizing materials with significantly higher dielectric constants than deposited or thermally formed silicon-oxides, gate dielectric 120 maybe fabricated at a thickness that is roughly proportional to the ratio of the dielectric constant of gate dielectric 120 to the dielectric constant of thermally formed silicon-oxide. If, for example, a particular submicron transistor fabrication process required a thermally formed SiO$_2$ film of approximately 5 to 20 angstroms to produce a suitably operational transistor, the present invention contemplates the substitution of the ultra thin gate dielectric with a substantially thicker gate dielectric layer 120 without sacrificing the operational characteristics associated with the conventionally formed transistor. If, for example, a gate dielectric material with a dielectric constant in the range of approximately 80 is chosen, the thickness of the gate dielectric layer of 120 can be fabricated with a thickness in the range approximately 20 times the thickness of a silicon-oxide gate dielectric. It is theorized that the substitution of a high K dielectric material for the gate dielectric of an MOS transistor will result in comparable operational characteristics without inviting the reliability and manufacturing problems associated with fabricating ultra thin gate oxides. These problems, among others, include the inherent unreliability of ultra thin films due to the high electric field associated with biasing one or more of the transistor terminals and the manufacturing difficulty of producing films in the 5 to 25 angstrom regime.

In a presently preferred embodiment, the gate dielectric material 120 maybe suitably achieved with a chemical vapor deposition process using an oxygen compound. Suitable oxygen compounds include Beryllium-oxide (Be$_x$O$_y$), Magnesium-oxide (Mg$_x$O$_y$), Zirconium dioxide (ZrO$_2$), Calcium-oxide (Ca$_x$O$_y$), Titanium dioxide (TiO$_2$), and Tantalum-oxide (Ta$_2$O$_5$). In one embodiment, the deposition of the gate dielectric layer is accomplished with a CVD process in which the semiconductor substrate 102 is immersed in a CVD reactor chamber maintained at a temperature at approximately 200 to 900° C. and a pressure of less than approximately 2 torrs. An oxygen ambient is then introduced into the CVD reactor chamber along with the introduction of a high K material into the chamber. (For purposes of this disclosure, a high K material refers to an elements or compound known to react with the oxygen and to produce a resulting oxide that has a dielectric constant in excess of approximately 70). As indicated previously, suitable high K materials include Beryllium, Magnesium, Zirconium, Calcium, Titanium, and Tantalum. It would be appreciated to those skilled in the art that alternative processes to typical CVD or plasma enhanced CVD processes maybe used to suitably deposit gate dielectric 120 on semiconductor substrate 102. In one embodiment, the deposition of gate dielectric 120 maybe accomplished, for example, with a physical vapor deposition process such as a sputter process in which a suitable target is bombarded with energetic ions to release particles of a desirable material in the presence of an electric field which guides the particles towards the semiconductor substrate.

Figure 3:
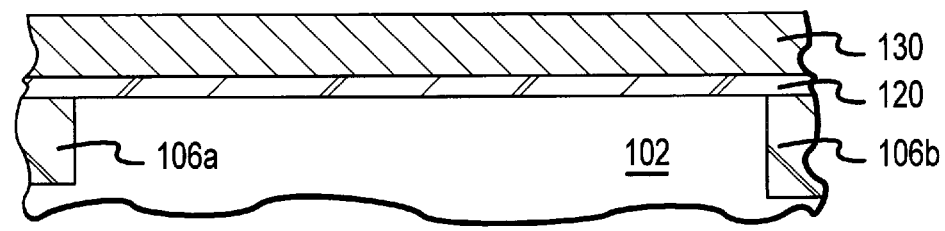
FIG. 3 is a processing step subsequent to FIG. 2 in which a conductive gate layer is formed over the gate dielectric.

Turning now to FIG. 3, a conductive gate layer 130 is formed over gate dielectric layer 120. In the preferred embodiment, conductive gate layer 130 comprised heavily doped polysilicon. The preferred process for the formation of conductive gate layer includes the thermal decomposition of silane in a CVD reactor chamber maintained at a temperature in the range of approximately 580 to 650° C. and a pressure of less than approximately 2 torrs. After the deposition of the polysilicon, the polysilicon layer is typically implanted with phosphorus, arsenic, or boron to reduce a sheet resistivity of the conductive gate layer to less than approximately 50 Ω/sq.

Turning now to FIG. 4, a first nitrogen distribution 142 is introduced into gate dielectric 120, preferably through the use of an ion implantation process represented in FIG. 4 by reference no. 140. In a presently preferred embodiment, ion implantation process 140 is accomplished using an implant energy in arrange of approximately 50 to 1000 keV using a nitrogen bearing implant species and an implant dose in the range of approximately $1 \times 10^{13}$ to $5 \times 10^{15}$ atoms/cm$^2$. As shown in greater detail in the exploded view of FIG. 4, the introduction of the first nitrogen distribution into gate dielectric layer 120 is preferably performed under conditions such that a peak concentration of the first nitrogen distribution 142 is located at approximately an interface between semiconductor substrate 102 and gate dielectric layer 120. Locating first nitrogen distribution 142 at the semiconductor substrate interface accomplishes two goals. First, the presence of the nitrogen distribution 142 substantially reduces or eliminates the occurrence of a subsequent oxidation during high temperature processing at the dielectric-substrate interface. Prevention of inadvertent thermal oxidation at this interface is important in an application in which one of the primary purposes of incorporating the high K dielectric 120 is to achieve the electrical equivalent of an extremely thin thermally formed silicon dioxide gate dielectric. (For purposes of this disclosure, two gate dielectric films are said to be electrically equivalent if both films have approximately the same film thickness to dielectric constant ratio). If, for example, gate dielectric layer 120 approximates the electrical equivalent of a 10 angstrom silicon dioxide dielectric film, it will be appreciated to those skilled in the art that any significant thermal oxidation that occurs prior to or subsequent to the formation of gate dielectric 120 will have a significant impact on the operating characteristics of the subsequently formed transistor. The second advantage of incorporating a nitrogen distribution 142 at the dielectric/substrate interface is that the nitrogen distribution 142 provides an excellent barrier to the migration of mobile contaminants within gate dielectric 120 and conductive gate layer 130. In particular, boron atoms associated with p-type transistor gates are known to travel relatively rapidly through the conductive gate layer and the gate dielectric layer and can redistribute within a channel region of semiconductor substrate 102 thereby causing an unwanted and inadvertent threshold voltage shift in the p-channel transistors. By incorporating the first nitrogen distribution 142, and thereby limiting the migration of boron, the resulting integrated circuit will be more stable and reliable over time.

Turning now to FIG. 5, a second nitrogen distribution 152 is introduced into gate dielectric 120 preferably through the use of an ion implantation process represented in FIG. 5 by reference numeral 150. In a preferred embodiment, the ion implantation process 150 is carried out using a second nitrogen bearing species a second implant energy, and a second implant dose. Preferably, the second implant energy is in the range of approximately 50 to 1000 keV and the second implant dose is in the range of approximately $1 \times 10^{13}$ to $5 \times 10^{15}$ atoms/cm$^2$. As seen in the exploded view of FIG. 5, the second nitrogen distribution 152 is located, in a presently preferred embodiment, at an interface between conductive gate layer 130 and gate dielectric layer 120. To achieve this location of the second nitrogen distribution 152, it will be appreciated that the second implant energy associated with implant process 150 is less than the first implant energy associated with the first implantation process 140 shown and described with respect to FIG. 4 above. For reasons similar to the reasons described above with respect to the first nitrogen distribution 142, second nitrogen distribution 152 is desirable to prevent inadvertent thermal oxidation at the conductive gate layer/gate dielectric layer interface and to further prevent the migration of mobile contaminants within conductive gate layer 130 through dielectric layer 120 and into the active region 104 semiconductor substrate 102. An approximation of the second nitrogen distribution 152 within conductive gate layer 130 and gate dielectric layer 120 is shown graphically by the bell curve of FIG. 5 which will be familiar to those skilled in the art of embodiment implantation processes and ion implant distributions. (A similar distribution representation is shown with respect to the first nitrogen distribution 142 shown and described with respect to FIG. 4 above).

Turning now to FIG. 6, the transistor 161 is completed by several well know processing steps in which the conductive gate layer 130 is patterned to produce a conductive gate electrode 131. Conductive gate electrode 131 is aligned above a channel region 163 of semiconductor substrate 102. Channel region 163 is laterally displaced between a pair of source/drain region 162A and 162B (collectively referred to as source/drain regions 162). In a presently preferred embodiment, a lateral detention $L_D$ of gate electrode 131 is in the range of approximately 0.1 to 0.5 microns. Those familiar with short channel transistor theory will appreciate that the combination of a sub-micron channel length with a gate dielectric layer having a thickness in the range of approximately 50 to 1,000 angstroms typically results in significant and undesirable short channel effects associated with transistor 161. To avoid short channel effects in conventional silicon dioxide gate dielectric sub-microns transistors, is to typically necessary to scale the thickness of the gate dielectric to a thickness in the range of approximately less than 100 angstroms. By incorporating a high K dielectric material into gate dielectric layer 120, the present invention contemplates the fabrication of a sub-micron transistor 161 in which the gate dielectric layer 120 is permitted to have a dielectric thickness significantly greater than the thickness associated with the conventional formed transistors.

The patterning of conductive gate layer 130 to achieve the gate electrode 131 is carried out in a conventional photolithography process in which a photoresist layer is deposited upon conductive gate layer 130 and thereafter exposed using a photolithography mask to achieve a patterned photoresist layer. The patterned photoresist layer is then used to achieve a selective etch of the conductive gate layer. The alignment of gate electrode 131 with channel region 163 is achieved by implanting the source/drain regions 162 subsequent to the patterning of gate electrode 131 whereby the gate electrode 131 is said to be self aligned to the source/drain electrode 160a and 160b (collectively referred to as source/drain electrodes 160). The transistor 161 is shown in FIG. 6, further includes, as will be appreciated to those skilled in the art, lightly doped regions 164a and 164b and spacer structures 166a and 166b formed on the sidewalls of the conductive gate electrode 131. The incorporation of spacer structures and lightly doped regions into transistors 161 is a well known feature of semiconductor transistors having channel lengths less than approximately 2 microns. Lightly doped regions improve reliability by reducing the maximum electric field that occurs proximal to the channel region 163 of transistor 161 during operation of transistor 161. The spacer structures 166 are typically comprised of a dielectric material such as a CVD oxide. In addition to facilitating the fabrication of lightly doped regions and heavily doped regions, spacer structures 166 are necessary and useful to achieve a selective deposition of a refractory metal for self aligned silicide formation over the exposed silicon source/drain electrodes 160 and gate electrode 131. Silicides are useful to reduce the sheet resistivity of the associated silicon regions thereby minimizing contact resistance and improving the theoretical operational speed of the subsequently formed device.

It will be appreciated to those skilled in the art that the present invention contemplates the formation of a sub-micron transistor using a high K dielectric material such that the thickness of the dielectric can be significantly relaxed relative to the thickness required of a silicon dioxide type dielectric film. It is understood that the form of the invention shown and described in the detailed description and the drawings are to be taken merely as presently preferred examples of how nitrogen can be incorporated into the gate dielectric and the conductive gate of an MOS transistor. It is intended that the following claims be interpreted broadly to embrace all the variations of the preferred embodiments disclosed.

What is claimed is:

1. A semiconductor process for forming a gate electrode of an MOS transistor, said process comprising:

depositing a gate dielectric layer on an upper surface of a semiconductor substrate, wherein a dielectric constant of said gate dielectric layer is in the range of approximately 25 to 300 and wherein a thickness of said gate dielectric is in the range of approximately 50 to 1000 angstroms;

forming a conductive gate layer on said gate dielectric layer;

introducing a first nitrogen distribution into said gate dielectric layer by implanting a first nitrogen bearing implant species into said gate dielectric layer using a first implant energy and a first implant dose, wherein a peak impurity concentration of said first nitrogen distribution resides approximately at a depth of an interface between said semiconductor substrate and said gate dielectric layer; and introducing a second nitrogen distribution into said gate dielectric layer by implanting a second nitrogen bearing impurity distribution into said gate dielectric layer using a second implant energy and a second implant dose, wherein a peak impurity concentration of said second nitrogen distribution resides approximately at a depth of an interface between said gate dielectric layer and said conductive gate layer.

2. The process of claim 1, wherein said gate dielectric layer comprises an oxide selected from the group comprising $Be_xO_y$, $Mg_xO_y$, $ZrO_2$, $Ca_xO_y$, $TiO_2$ and $Ta_2O_5$.

3. The process of claim 2, wherein the step of depositing said gate dielectric comprises immersing said semiconductor substrate in a CVD reactor chamber comprising an oxygen bearing ambient maintained at a temperature of approximately 200 to 900° C. and a pressure of less than approximately 2 torrs.

4. The process of claim 1, wherein the step of forming said conductive gate layer comprises depositing a polysilicon layer by thermally decomposing silane in a CVD reactor chamber maintained at a temperature in the range of approximately 580 to 650° C. and a pressure of less than approximately 2 torrs.

5. The process of claim 4, wherein the step of forming said conductive gate layer further comprises introducing a gate impurity distribution into said polysilicon layer wherein a concentration of said gate impurity distribution is sufficient to reduce a sheet resistivity of said polysilicon to less than approximately 50 Ω/square.

6. The process of claim 1, wherein said first implant energy is in the range of approximately 50 to 1000 keV and said first implant dose is in the range of approximately $1\times10^{13}$ to $5\times10^{15}$ atoms/cm$^2$.

7. The process of claim 1, wherein said second implant energy is in the range of approximately 50 to 1000 keV and said second implant dose is in the range of approximately $1\times10^{13}$ to $5\times10^{15}$ atoms/cm$^2$, and further wherein said second implant energy is less than said first implant energy.

8. A process for fabricating an MOS transistor, said process comprising:

depositing a gate dielectric layer on an upper surface of a semiconductor substrate, wherein a dielectric constant of said gate dielectric layer is in the range of approximately 40 to 150 and wherein a thickness of said gate dielectric is in the range of approximately 50 to 1000 angstroms;

forming a conductive gate layer on said gate dielectric layer;

introducing a first nitrogen distribution into said gate dielectric layer by implanting a first nitrogen bearing implant species into said gate dielectric layer using a first implant energy and a first implant dose, wherein a peak impurity concentration of said first nitrogen distribution resides approximately at a depth of an interface between said semiconductor substrate and said gate dielectric layer;

introducing a second nitrogen distribution into said gate dielectric layer by implanting a second nitrogen bearing impurity distribution into said gate dielectric layer using a second implant energy and a second implant dose, wherein a peak impurity concentration of said second nitrogen distribution resides approximately at a depth of an interface between said gate dielectric layer and said conductive gate layer;

patterning said gate dielectric layer to form a gate electrode, wherein said gate electrode is aligned over a channel region of said semiconductor substrate;

implanting at least one source/drain impurity distribution into source/drain regions located within said semiconductor substrate laterally displaced on either side of said channel region; and annealing said semiconductor substrate in an inert ambient maintained at a temperature in excess of approximately 500° C. to activate said source/drain impurity distribution.

9. The process of claim 8, wherein a lateral dimension of said channel region is in the range of approximately 0.1 to 0.5 microns.

10. The process of claim 8, wherein said gate dielectric layer comprises an oxide selected from the group comprising $Be_xO_y$, $Mg_xO_y$, $ZrO_2$, $Ca_xO_y$, $TiO_2$, and $Ta_2O_5$.

11. The process of claim 8, wherein the step of forming said conductive gate layer comprises depositing a polysilicon layer by thermally decomposing silane in a CVD reactor chamber maintained at a temperature in the range of approximately 580 to 650° C. and a pressure of less than approximately 2 torrs and, thereafter, introducing a gate impurity distribution into said polysilicon layer wherein a concentration of said impurity distribution is sufficient to reduce a sheet resistivity of said polysilicon to less than approximately 50 Ω/square.

12. The process of claim 1, wherein said first implant energy is in the range of approximately 50 to 1000 keV and said first implant dose is in the range of approximately $1\times10^{13}$ to $5\times10^{15}$ atoms/cm$^2$.

13. The process of claim 1, wherein said second implant energy is in the range of approximately 50 to 1000 keV and said second implant dose is in the range of approximately $1\times10^{13}$ to $5\times10^{15}$ atoms/cm$^2$, and further wherein said second implant energy is greater than said first implant energy.

14. The process of claim 8, wherein the step of patterning said conductive gate layer comprises forming a patterned photoresist layer on said conductive gate layer and, thereafter, performing a plasma etch process to remove portions of said conductive gate layer not protected by said patterned mask.

15. The process of claim 8 wherein the step of implanting said source/drain impurity distribution comprises implanting arsenic, phosphorous, or boron into said source/drain regions, and further wherein a peak concentration of said source/drain impurity distribution is in excess of approximately $1\times10^{19}$ atoms/cm$^3$.

* * * * *